(12) United States Patent
Shimanuki

(10) Patent No.: US 7,373,132 B2
(45) Date of Patent: May 13, 2008

(54) HIGH FREQUENCY SIGNAL RECEIVER

(75) Inventor: Masaru Shimanuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 892 days.

(21) Appl. No.: 10/869,140

(22) Filed: Jun. 16, 2004

(65) Prior Publication Data

US 2005/0028210 A1 Feb. 3, 2005

(30) Foreign Application Priority Data

Jun. 18, 2003 (JP) .............................. 2003-173822
May 17, 2004 (JP) .............................. 2004-146917

(51) Int. Cl.
*H04B 1/26* (2006.01)

(52) U.S. Cl. ...................... 455/324; 455/102; 455/118; 375/285

(58) Field of Classification Search ................ 455/324, 455/102, 103, 115, 118, 126, 127, 129, 295; 375/285, 346, 350; 327/103, 124, 143
See application file for complete search history.

(56) References Cited

U.S. PATENT DOCUMENTS 5,263,197 A 11/1993 Manjo et al.

(Continued)

FOREIGN PATENT DOCUMENTS

EP 1 052 781 11/2000

(Continued)

OTHER PUBLICATIONS

Patent Abstracts of Japan, vol. 2002, No. 11. Nov. 6, 2002 & JP 2002 190750 A (Sony Corp), Jul. 5, 2002.

*Primary Examiner*—Tony T. Nguyen
(74) *Attorney, Agent, or Firm*—Frommer Lawrence & Haug LLP; William S. Frommer

(57) ABSTRACT

A high frequency signal receiver can prevent higher harmonics other than a necessary higher harmonic from being subjected to frequency conversion so as to interfere with the base band signal in a broadcasting channel frequency band. The receiver has a high frequency signal receiving circuit 1 that comprises an input circuit 3 to which a high frequency signal (RF signal) subjected to frequency conversion from a 12 GHz band to a 1 to 2 GHz band is input, a mixer circuit 4 adapted to frequency convert the signal of 1 to 2 GHz band output from the input circuit 3 into a base band signal, a local oscillation output circuit section 5 adapted to supply a signal of a frequency band to be mixed with the signal output of the input circuit 3 to the mixer circuit 4 and a PLL circuit section 6 to which the source oscillation output signal from the local oscillation output circuit section 5 is input. The local oscillation output circuit section 5 has an oscillation circuit 51, a higher harmonic output circuit 52 that generates the fourth harmonic of the output signal of the oscillation circuit 51 and a resonance circuit 53. It controls both the resonance frequency of the resonance circuit 53 of the local oscillation output circuit section 5 and the frequency characteristic of the input circuit 3 by means of the control voltage output from the PLL circuit section 6 so as to boost the higher harmonic of an order that corresponds to desired broadcasting channel frequency and attenuate higher harmonics of all other orders that appear in other frequency bands that overlap the broadcasting channel frequency in the input circuit 3.

5 Claims, 6 Drawing Sheets

U.S. PATENT DOCUMENTS

| | | | |
|---|---|---|---|
| 6,091,940 A * | 7/2000 | Sorrells et al. | 455/118 |
| 6,281,946 B1 | 8/2001 | Hisada et al. | |
| 7,236,754 B2 * | 6/2007 | Sorrells et al. | 455/118 |
| 2002/0055344 A1 | 5/2002 | Shimoda | |

FOREIGN PATENT DOCUMENTS

| | | |
|---|---|---|
| JP | 5 36937 | 5/1993 |
| JP | 11 331011 | 11/1999 |
| JP | 2000 307444 | 11/2000 |
| JP | 2001 77875 | 3/2001 |
| JP | 2003 152558 | 5/2003 |
| WO | WO 93 02507 | 2/1993 |

* cited by examiner

HIGH FREQUENCY SIGNAL RECEIVER

BACKGROUND OF THE INVENTION

1. Field of the Invention

This invention relates to a high frequency signal receiver to be typically installed in a tuner of a television receiving set.

This application claims the priority of the Japanese Patent Application Nos. 2003-173822 filed on Jun. 18, 2003 and 2004-146917 filed on May 17, 2004, the entirety of which is incorporated by reference herein.

2. Related Background Art

As a radio wave for digital broadcasting using a broadcasting satellite (to be referred to as BS hereinafter) or a communications satellite (to be referred to as CS hereinafter) is received by a parabolic antenna, it is converted into a high frequency signal (RF signal) of 1 to 2 GHz and then the signal is sent to the high frequency signal receiver of a so-called set top box or tuner having a functional feature of receiving satellite broadcasting. The high frequency signal receiver is provided with a frequency converter for down-converting the RF signal input from the antenna into a signal with a predetermined frequency by mixing it with a locally oscillated signal coming from a local oscillation circuit.

With the trend of producing high density integrated circuits (to be referred to as IC hereinafter) in recent years, ICs that are used as frequency converters are often made to integrally comprise a frequency conversion circuit and a PLL circuit. Particularly, so-called direct conversion type ICs have been developed for frequency converters to be used for tuners for BS and CS broadcasting because they are adapted to directly down-covert the RF signal input to it by way of an antenna into a base band signal without requiring converting it into an intermediate frequency signal (IF signal).

For example, Patent Document 1 (Japanese Patent Application Laid-Open Publication No. 2002-190750) describes a direct conversion type frequency converter adapted to be installed in a tuner in a television receiving set.

Meanwhile, when a frequency converter is prepared by using a direct conversion type IC, the frequency of the signal output from a local oscillation output circuit is between 1 and 2 GHz, which is same as the frequency of the RF signal of the desired and selected channel coming from the antenna. An oscillator that directly oscillates such a high frequency wave of 1 to 2 GHz requires the use of costly parts and additionally can be influenced by distributed capacities and inductors so that it is difficult to regulate it and make it operate stably. For this reason, it has been conceived to use an source oscillator that oscillates approximately at a frequency in the so-called VHF or UHF frequency band and taking out a higher harmonic, e.g., fourth harmonic, of the oscillation output of the source oscillator and using it as locally oscillated output signal.

When a higher harmonic, e.g., fourth harmonic, is used for a locally oscillated output signal and if higher harmonics other than the fourth harmonic required for direct conversion are also input to a mixer circuit and the RF signal from the antenna contains a broadcast signal of the channel that corresponds to any of the unnecessary higher harmonics, the broadcast signal is also converted into a base band signal by frequency conversion.

SUMMARY OF THE INVENTION

In view of the above identified circumstances, it is therefore the object of the present invention to provide a high frequency signal receiver that can prevent the problem that higher harmonics other than the necessary one is converted into a base band signal by frequency conversation from taking place when a higher harmonic is used for a locally oscillated output signal.

In an aspect of the present invention, the above object of the invention is achieved by providing a direct conversion type high frequency signal receiver adapted to convert the high frequency signal obtained by receiving a digital broadcast signal from a broadcasting satellite or a communications satellite into a base band signal by frequency conversion, the receiver comprising: an input circuit for inputting high frequency signals; a mixer circuit for converting a signal having a desired frequency and obtained from the input circuit into a base band signal by frequency conversion; and a local oscillation output circuit section for supplying the mixer circuit with a signal having a desired frequency to be mixed with the signal from the input circuit; the local oscillation output circuit section having an source oscillator and a higher harmonic output circuit for taking out a higher harmonic of the output signal of the source oscillator as a signal having a desired frequency; the input circuit having a frequency characteristic of removing all the higher harmonics of the output signal other than the higher harmonic having the desired frequency.

A high frequency signal receiver according to the invention further comprises a PLL circuit section for receiving an source oscillation output signal of the source oscillator of the local oscillation output circuit section, the control voltage from the PLL circuit section being used to control the resonance frequency of the source oscillator of the local oscillation output circuit section and the frequency characteristic of the input circuit. The PLL circuit section has a frequency divider for dividing the frequency of the source oscillation output signal from the source oscillator of the local oscillation output circuit section by a dividing ratio corresponding to a station selection signal, a phase comparator for comparing the output from the frequency divider with a reference frequency and a frequency-voltage converter for converting the output signal from the phase comparator into the control voltage. In a high frequency receiver according to the invention, a resonance circuit is connected to the source oscillator of the local oscillation output circuit section and the resonance frequency of the resonance circuit is controlled by the control voltage from the PLL circuit section; while the input circuit has a characteristic of boosting the higher harmonic of the broadcasting channel frequency to be used for the desired frequency and attenuating higher harmonics other than the higher harmonic found around other broadcasting channel frequencies, the frequency to be boosted and the frequencies to be attenuated being controlled by the control voltage from the PLL circuit section. The higher harmonic output circuit of the local oscillation output circuit section is adapted to take out the fourth harmonic of the source oscillation output signal from the source oscillator and the input circuit is adapted to remove the third harmonic of the source oscillation output signal.

Thus, a high frequency signal receiver according to the invention takes out a signal having a desired frequency that operates as a higher harmonic of the output signal of the source oscillator by means of the higher harmonic output circuit contained in the local oscillation output circuit section and removes all the higher harmonics other than the higher harmonic having the desired frequency by means of the input circuit.

As described above in detail, a high frequency signal receiver according to the invention can acquire an oscillation frequency for a high frequency signal of BS or CS digital broadcasting by means of a general purpose oscillation circuit for a VHF and UHF frequency band that is low cost and hardly influenced by distributed capacities and inductors and amplify a signal having a desired frequency that is equal to a higher harmonic of the output signal of the source oscillator by means of a higher harmonic output circuit included in a local oscillation output circuit section so as to reduce the gain of the frequency band of higher harmonics of orders that can maximally influence all the broadcasting channel frequencies other than the target broadcasting channel frequency out of the higher harmonics generated in order to acquire the oscillation frequency of the target broadcasting channel frequency. Thus, I/Q signals to be output are stabilized to improve the reception performance.

DETAILED DESCRIPTION OF THE PREFERRED EMBODIMENTS

Figure 1:
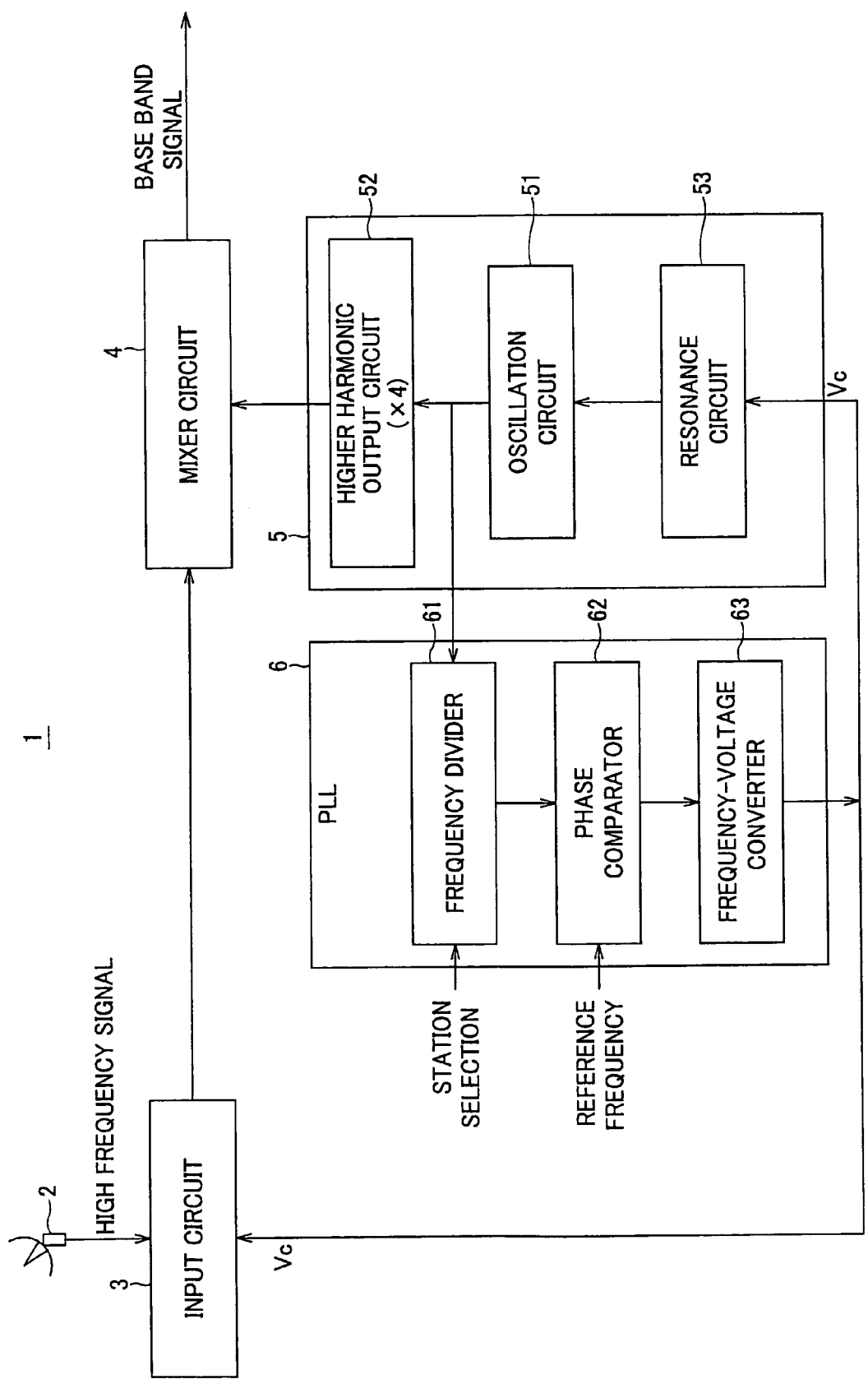
FIG. 1 is a schematic block diagram of an embodiment of high frequency signal receiving circuit according to the invention.

Now, the present invention will be described in greater detail by referring to the accompanying drawings that schematically illustrate an embodiment of the invention, which is a high frequency signal receiving circuit 1. The high frequency signal receiving circuit 1 of FIG. 1 is a direct conversion type high frequency signal receiving circuit adapted to receive a high frequency signal of 1 to 2 GHz band obtained from a digital broadcast signal of about 12 GHz band transmitted from a broadcasting satellite (to be referred to as BS hereinafter) or a 110° communications satellite (to be referred to as CS hereinafter) and frequency-convert it into a base band signal. The high frequency signal receiving circuit can directly down-convert an RF signal input to it by way of an antenna into a base band signal by inputting the target broadcasting channel frequency into a mixer circuit as local oscillation output signal without converting the RF signal into an intermediate frequency signal (IF signal). This embodiment of high frequency signal receiving circuit has a characteristic of amplifying a higher harmonic of the n-th order as desired broadcasting channel frequency from the input 1 to 2 GHz high frequency signal and removing all the higher harmonics other than the higher harmonic of the n-th order. In this embodiment, it is assumed that the source oscillator generates a fourth harmonic and all the other higher harmonics are removed.

The high frequency signal receiving circuit 1 comprises an input circuit 3 to which a high frequency signal (RF signal) received by antenna 2 and subjected to frequency conversion from a 12 GHz band to a 1 to 2 GHz band is input, a mixer circuit 4 adapted to frequency convert the signal of 1 to 2 GHz band output from the input circuit 3 into a base band signal and a local oscillation output circuit section 5 adapted to supply a signal of a frequency band to be mixed with the signal output of the input circuit 3 to the mixer circuit 4. In this embodiment, a digital broadcast signal of 12 GHz band input to the antenna 2 is converted into a high frequency signal (RF signal) of about 1 to 2 GHz band by a converter arranged in the antenna. The high frequency signal is then input to the input circuit 3.

The local oscillation output circuit section 5 has an oscillation circuit 51 that operates as source oscillator and a higher harmonic output circuit 52 that generates the fourth harmonic of the output signal of the oscillation circuit 51 and takes out the signal of the desired broadcasting channel frequency as the fourth harmonic of the output signal of the oscillation circuit 51 and a resonance circuit 53. In the embodiment, it is assumed that the output signal from the oscillation circuit 51 that operates as source oscillator is a source oscillation output signal and the output signal from the higher harmonic output circuit 52 is a local oscillation output signal. The resonance frequency of the resonance circuit 53 is controlled by the control voltage from PLL circuit section 6, which will be described hereinafter, and the resonance circuit 53 is connected to the oscillation circuit 51.

The high frequency signal receiving circuit 1 additionally comprises a PLL (phase locked loop, to be referred to as PLL hereinafter) circuit section 6 to which the source oscillation output signal from the local oscillation output circuit section 5 is input. The control voltage output from the PLL circuit section 6 is fed to the input circuit 3 and the resonance circuit 53 and both the resonance frequency of the resonance circuit 53 of the local oscillation output circuit section 5 and the frequency characteristic of the input circuit 3 are controlled by the control voltage.

The PLL circuit section 6 has a frequency divider 61 adapted to divide the frequency of the source oscillation output signal to a dividing ratio that corresponds to a station selection signal, a phase comparator 62 adapted to compare the output of the frequency divider 61 with a reference frequency and a frequency-voltage converter 63 for converting the output signal from the phase comparator 62 into a control voltage.

In an ordinary high frequency signal receiver, a high pass filter (to be referred to as HPF hereinafter) is used as input circuit that is arranged in the RF signal input terminal for receiving the signal from the antenna. The HPF is mainly configured for impedance matching with a fixed HPF that is adapted to attenuate the frequencies of the UHF band and lower frequencies and has a frequency characteristic of broadly passing the reception band. When the basic wave from the oscillator is used as local oscillation output signal of the frequency converter of an ordinary high frequency signal receiver, the higher harmonic components of the basic wave would not be input to the mixer circuit if the input circuit has a characteristic of broadly passing the reception band because the frequencies of the higher harmonics are separated by far from that of the basic wave.

However, when a higher harmonic of the source oscillation output signal of the source oscillator is used as local oscillation output signal, the higher harmonic component of the n-th order of the source oscillation output signal and the higher harmonic components of orders close to the n-th order appear in respective frequency bands that are close to each other. Therefore, when the input circuit has a characteristic of broadly passing the reception band, it can pass the higher harmonics of order close to the order of the target higher harmonic. For example, when the fourth harmonic of the source oscillator is used as local oscillation output signal, higher harmonics other than the fourth harmonic that is necessary for direct conversion can be input to the mixer circuit. When the broadcasting channel frequency is found in a frequency band that corresponds to unnecessary higher harmonics, the broadcasting signal of the frequency band can also be converted into the base band by frequency conversion.

To the contrary, the input circuit 3 of the high frequency signal receiving circuit 1 having the above described configuration has a characteristic of boosting the higher harmonic of the order that corresponds to the desired broadcasting channel frequency and attenuating the higher harmonics of the orders other than the above order that appear in other broadcasting channel frequencies. The input circuit 3 is controlled for the boosting frequency and the attenuating frequencies by the control voltage from the PLL circuit section 6. In this embodiment, the higher harmonic output circuit 52 of the local oscillation output circuit section 5 is adapted to take out the fourth harmonic of the source oscillation output signal from the oscillation circuit 51 and the input circuit 3 has a characteristic of boosting the fourth harmonic of the desired broadcasting channel frequency and attenuating the third harmonic of the source oscillation output signal.

As described above, the high frequency signal receiving circuit 1 can avoid a situation where some other broadcasting channel frequency is found in or near the frequency band corresponding to the third harmonic that corresponds to the fourth harmonic of the source oscillation output signal from the oscillation circuit 51 that is regulated to acquire a desired broadcasting channel frequency and the broadcast signal of the former broadcasting channel frequency is subjected to frequency conversion to become an interference wave of the I signals and the Q signals.

Now, a digital tuner circuit to which the above described embodiment of high frequency signal receiving circuit is applied will be described in detail by referring to FIG. 2. The digital tuner circuit 100 of FIG. 2 comprises an arrangement for receiving an RF signal from the antenna 101 and amplifying the signal, an arrangement for demodulating I/Q signals and a 1-chip 8PSK demodulation IC developed for receiving inland BS/CS digital broadcastings.

The digital broadcast signal received by the antenna 101 is amplified to an appropriate level because it has been attenuated due to transmission loss by converter 102 arranged in the antenna 101 and subjected to frequency conversion typically from a 12 GHz band to a 1 to 2 GHz band before it is transmitted through a coaxial cable. The RF signal is input to the digital tuner 100 from input terminal 110. The transmitted RF signal is then input to the RF amplifier circuits 112, 113 by way of HPF 111.

AGC (auto gain controller) circuit 114 is adapted to control the gain of the RF signal that is input from the input terminal 110 and subsequently amplified by the RF amplifier circuits 112, 113 so that the RF signal is always held to a constant level.

High frequency signal receiving circuit section 115 is a direct conversion type high frequency signal receiving circuit that can directly down-convert the input RF signal into a base band signal without converting the TF signal into an intermediate frequency signal. It comprises an arrangement that corresponds to the local oscillation output circuit section described above by referring to FIG. 1. Oscillation circuit 116, higher harmonic generation circuit 117 and resonance circuit 118 in FIG. 2 respectively correspond to the oscillation circuit 51, the higher harmonic output circuit 52 and the resonance circuit 53 in FIG. 1. On the other hand, the input circuit 3 and the mixer circuit 4 in FIG. 1 respectively correspond to the HPF 111 and mixer circuits 121, 123 in FIG. 2.

Figure 2:
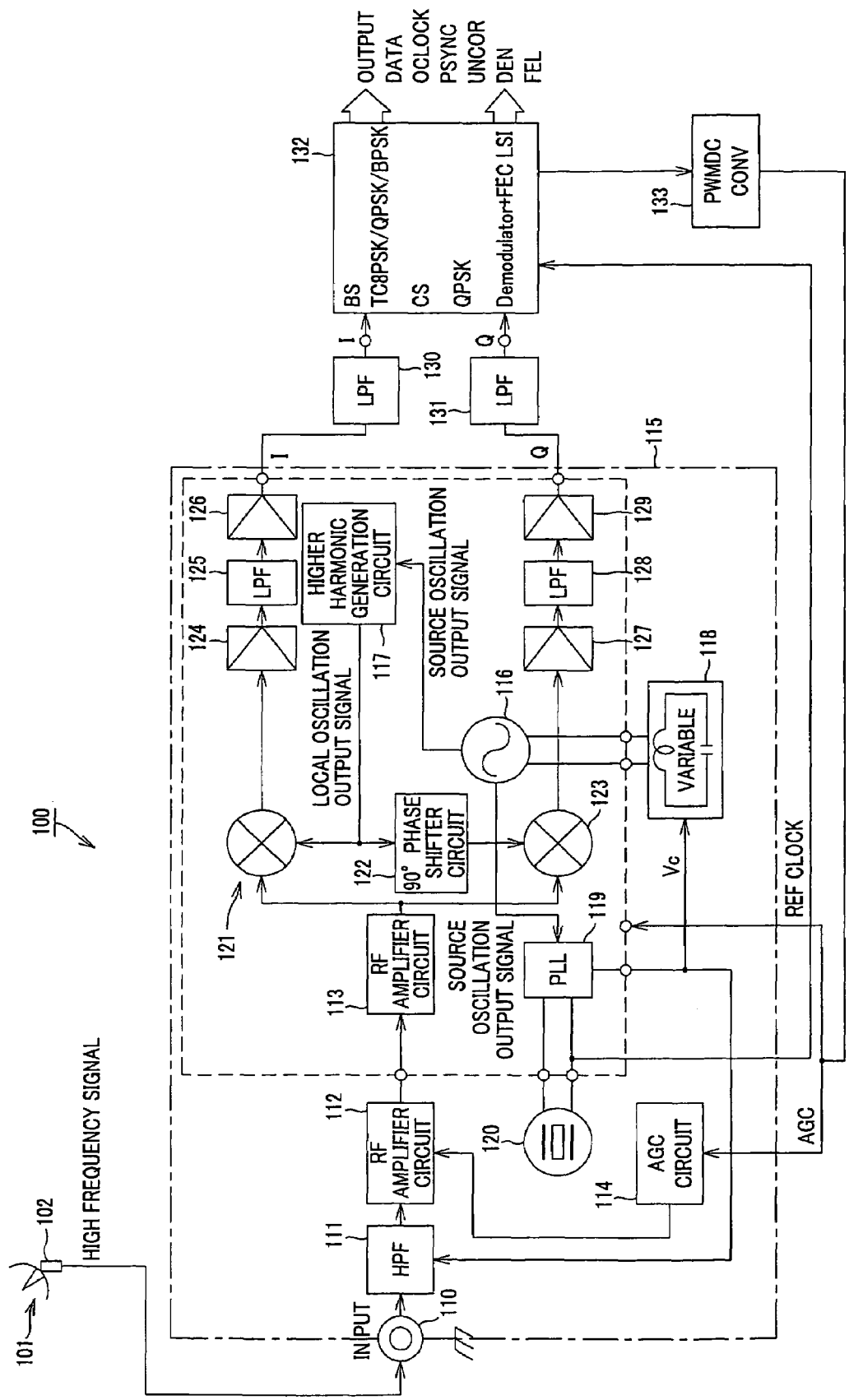
FIG. 2 is a schematic block diagram of a digital tuner circuit to which the high frequency signal receiving circuit of FIG. 1 is applied.

In the local oscillation output circuit section that comprises the oscillation circuit 116, the higher harmonic generation circuit 117 and the resonance circuit 118 shown in FIG. 2, the oscillation circuit 116 generates a source oscillation output signal and the higher harmonic generation circuit 117 generates a fourth harmonic of the output signal of the oscillation circuit 116 and takes out the signal of the desired broadcasting channel frequency as fourth harmonic of the output signal of the oscillation circuit 116. The resonance frequency of the resonance circuit 118 is controlled by the control voltage from PLL station selection circuit 119, which will be described hereinafter, and connected to the oscillation circuit 116. The oscillation circuit 116 generates a signal that oscillates with a frequency near the frequency of the input RF signal by way of the higher harmonic generation circuit 117.

The high frequency signal receiving circuit section 115 has the PLL station selection circuit 119 to which the source oscillation output signal from the local oscillation output circuit section is input. The control voltage Vc output from the PLL station selection circuit 119 is fed to the HPF 111 and the resonance circuit 118 that operate as input circuit and both the resonance frequency of the resonance circuit 119 and the frequency characteristic of the HPF 111 are controlled by the control voltage Vc.

The PLL station selection circuit 119 corresponds to the PLL circuit section 6 of FIG. 1 and, although not shown in FIG. 2, has a frequency divider for dividing the frequency of the source oscillation output signal from the oscillation circuit 116 of the local oscillation output circuit section by a dividing ratio corresponding to a station selection signal, a phase comparator for comparing the output from the frequency divider with a reference frequency and a frequency-voltage converter for converting the output signal from the phase comparator into the control voltage. The reference frequency input to the phase comparator is fed from reference frequency oscillator 120.

An oscillator that is adapted to directly oscillate a high frequency wave of 1 to 2 GHz is expensive and liable to be influenced by distributed capacities and inductors so that it is difficult to regulate it and make it operate stably. For this reason, a general purpose source oscillator that oscillates approximately at a frequency in the so-called VHF or UHF frequency band is used as the oscillation circuit 116 in this embodiment. The higher harmonic generation circuit 117 is adapted to take out a higher harmonic of the source oscillation output signal from the oscillation circuit 116 that operates as source oscillator and use it as a local oscillation output signal. A VHF high band oscillation circuit that is generally used in a TV tuner can be used for the oscillation circuit 116 that operates as source oscillator. The frequency of the source oscillation output signal obtained by the oscillation circuit 116 is quadrupled by means of the higher harmonic generation circuit 117 and the obtained fourth harmonic is used as demodulation signal.

For example, for an input RF signal of 1 GHz band, 250 MHz obtained by the VHF high band oscillation circuit is quadrupled to produce 1 GHz. Such a VHF high band oscillation circuit is used because it is a general purpose circuit and a peripheral circuit including such a circuit is popularly available, while it is less expensive if compared with an oscillation circuit adapted to oscillate at the input RF signal frequency.

In the above described high frequency signal receiving circuit section 115, the RF signal whose gain is controlled by the AGC circuit 114 is divided into I/Q signals and mixed with the local oscillation signal that is output from the higher harmonic generation circuit 117 and divided into I/Q signals by broad band 90° phase shifter circuit 122 by means of the mixer circuit 121 or 123, where it is subjected to frequency conversion to become a base band signal for each of the I/Q signals and output. Additionally, all the frequency components other than the base band signal are removed by filter circuit 124, circuit 125, circuit 126, circuit 127, circuit 128 and circuit 129 that are arranged downstream so that an I/Q signal output is obtained. The I/Q signals are then input to 8PSK demodulation IC 132 by way of LPF circuits 130, 131 that are provided with an adjacency trap feature. The I/Q signal output is converted into digital data by the 8PSK demodulation IC 132 and output with a necessary timing signal. A digitized signal is fed from the 8PSK demodulation IC 132 to PWM/DC converter 133, where it is converted into a DC signal and output to the AGC circuit 114.

In the digital tuner circuit 100 shown in FIG. 2, the RF amplifier circuit 113, the high frequency signal receiving circuit section 115, the oscillation circuit 116, the higher harmonic generation circuit 117, the PLL station selection circuit 119, the broad band 90° phase shifter circuit 122, the mixer circuit 121, the mixer circuit 123, the filter circuit 124, the circuit 125, the circuit 126, the circuit 127, the circuit 128 and the circuit 129 that constitute the high frequency signal receiving circuit section 115 are formed as a single IC.

Now, the effect of reducing the influence of the higher harmonics other than the target higher harmonic on other broadcasting channel frequency bands when the fourth harmonic of the source oscillation output signal is taken out as local oscillation output signal by the higher harmonic generation circuit 117 in the digital tuner circuit 100 will be described below.

When acquiring the fourth harmonic by the higher harmonic generation circuit 117, secondary and third harmonics and higher harmonics of the fifth, sixth and other orders are generated as a matter of fact. However, of the higher harmonics other than the fourth harmonic, those of the fifth, sixth and higher orders that are in higher frequency bands are not influential because no broadcasting channel frequencies exist in such frequency bands. If broadcasting channel frequencies exist in such frequency bands of such higher harmonics, their levels are such that they can be removed by means of a filter so that it is possible to make the mixer circuit 121 free from interferences.

However, the output level of the third harmonic that is generated when utilizing the fourth harmonic is high and close to that of the latter so that it is particularly difficult to suppress the possibility of interference of the third harmonic with the broadcasting channel frequency bands. Additionally, since some of the component circuits of the high frequency signal receiving circuit section 115 are formed as a single IC, any attempts for externally reducing the level of third harmonic face limitations. Still additionally, while the third harmonic that flows into the mixer circuit 121 would not interfere with the base band signal that is in the broadcasting channel frequency band if a single broadcasting channel frequency is involved, the input RF signal may come from any of a variety of broadcasting channel frequency bands so that the frequency band of the third harmonic can overlap with the frequency band of some other broadcasting channel.

Figure 3:
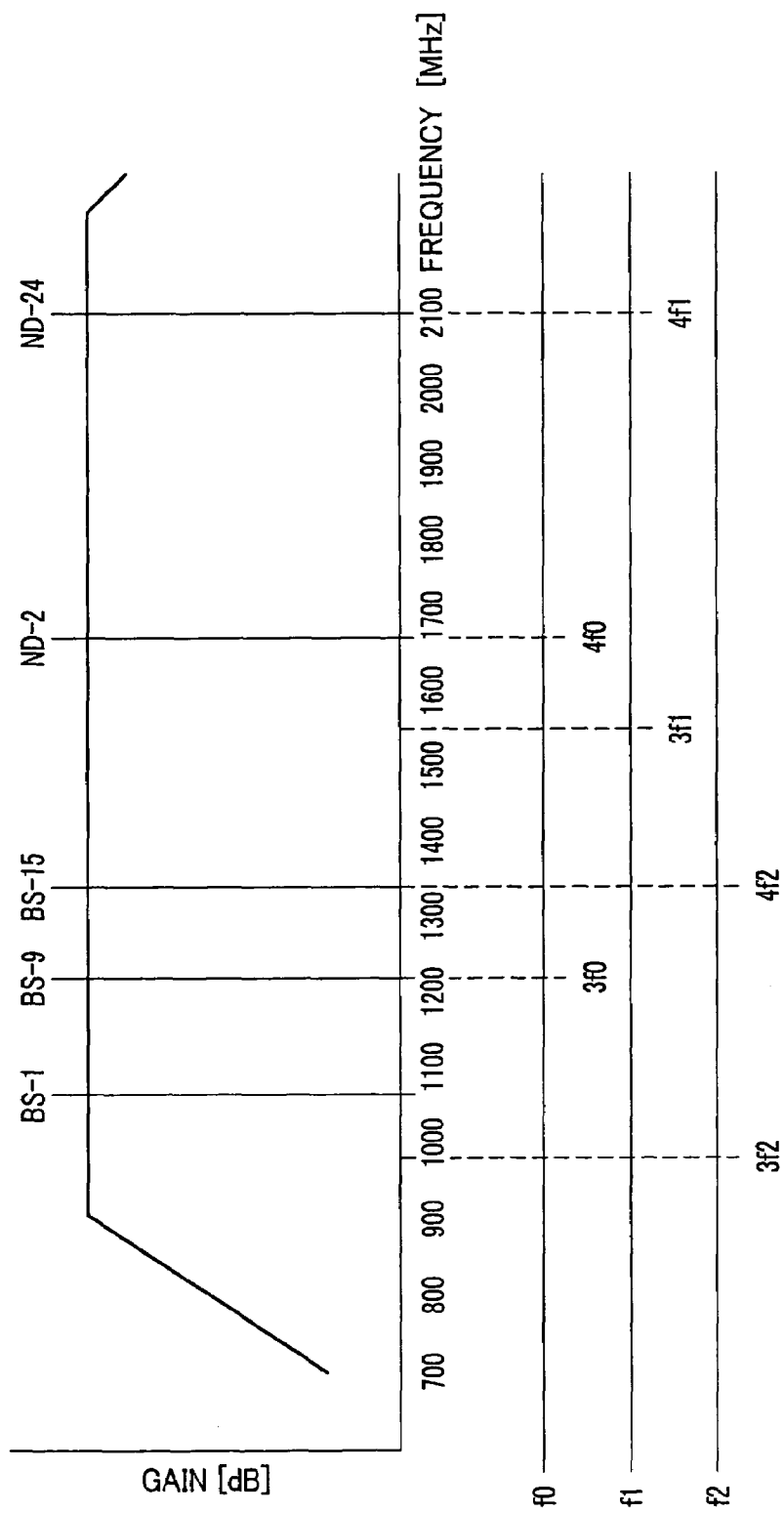
FIG. 3 is a graph illustrating the frequency characteristic of the RF signal transmission system whose gain is regulated by an AGC circuit of a digital tuner circuit as shown in FIG. 2.

FIG. 3 shows the frequency characteristic of an RF signal transmission system whose gain is regulated by the AGC circuit 114. Normally, the AGC circuit 114 regulates the gain so as to provide a predetermined output level. In FIG. 3, broadcasting channels including BS-1, BS-9, BS-15, ND-2 and ND-24 are shown.

Referring to FIG. 3, the frequency of the channel ND-2 is acquired as the fourth harmonic of the source oscillation output signal having a frequency of $f_0$. Then, the frequency $3f_0$ of the third harmonic of $f_0$ is found in a frequency band that is close to that of BS-9. Additionally, the frequency of the channel ND-24 is acquired as the fourth harmonic of the source oscillation output signal having a frequency of $f_1$. Then, the frequency $3f_1$ of the third harmonic of $f_1$ is found in a frequency band that is close to that of ND-2. Still additionally, the frequency of the channel BS-15 is acquired as the fourth harmonic of the source oscillation output signal having a frequency of $f_2$. Then, the frequency $3f_2$ of the third harmonic of $f_2$ is found in a frequency band that is close to that of BS-1.

Thus, as shown in FIG. 3, when the frequency band of a third harmonic overlaps that of a broadcasting channel frequency as in the case of the frequency of BS-9 that is close to the third harmonic of the frequency of ND-2, the frequency of BS-9 is down-converted into the base band signal of ND-2 to interfere with ND-2.

The digital tuner circuit 100 to which the above described embodiment is applied amplifies an RF signal whose frequency is same as the target broadcasting channel frequency by means of the HPF 111 that operates as input circuit and, at the same time, can trap the third harmonic of the source oscillation output signal.

Figure 4:
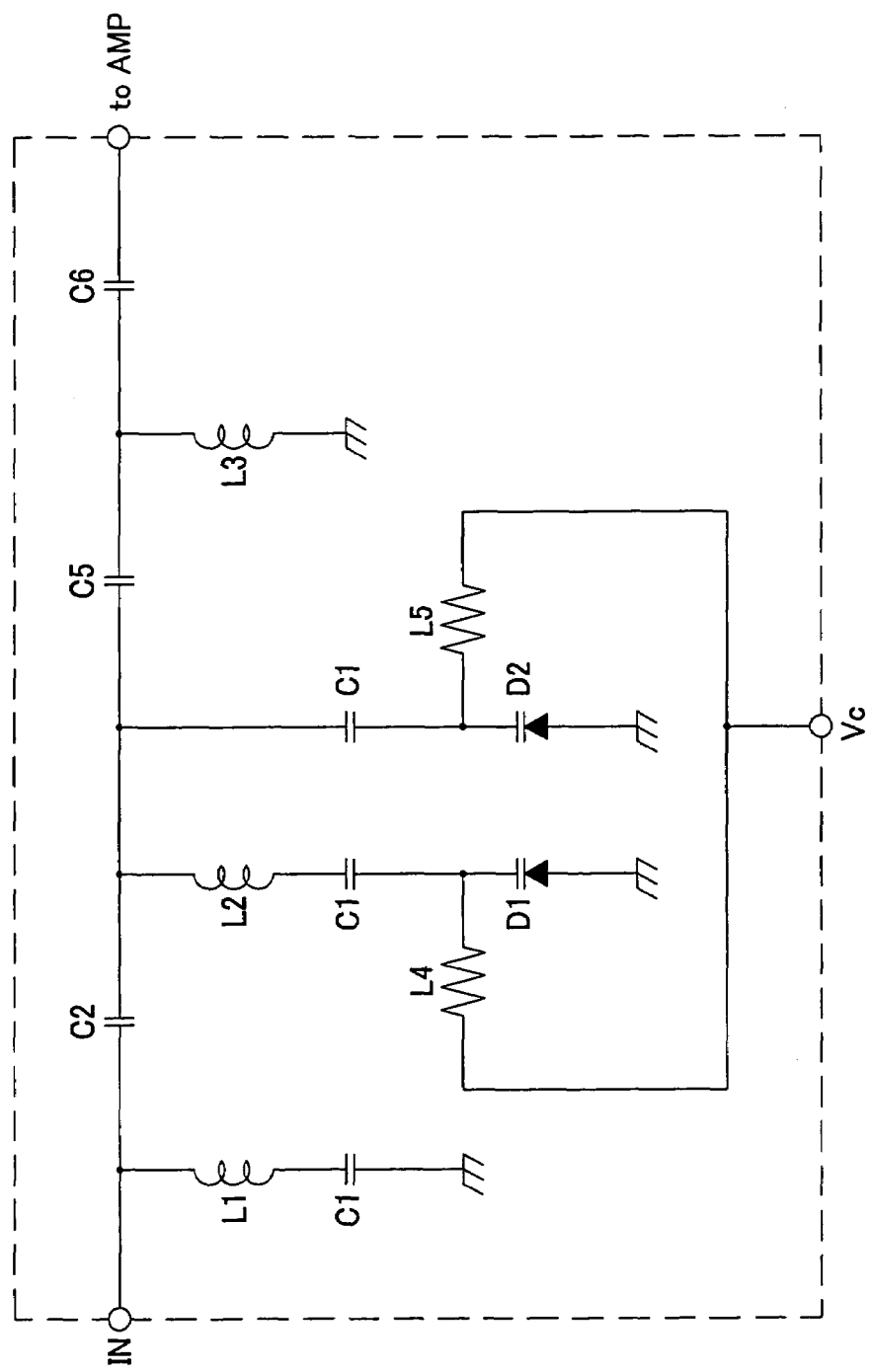
FIG. 4 is a schematic circuit diagram of an HPF to be used in a digital tuner as shown in FIG. 2.

The configuration of the HPF 111 that operates as input circuit of this embodiment will be described by referring to FIG. 4. As shown in FIG. 4, capacitor C3 and variable capacity diode D1 are connected in series with coil L2 and capacitor C4 and variable capacity diode D2 are connected in parallel with the coil L23 to form a π-type tuning circuit and a trap circuit. The trap circuit formed by C3, D1 and L2 is made variable to meet a frequency that is equal to ¾ of the oscillation frequency of the source oscillation output signal by the control voltage Vc from the PLL station selection circuit 119. The tuning circuit formed by L2, C4 and D2 is made variable to meet the control voltage Vc.

Figure 5:
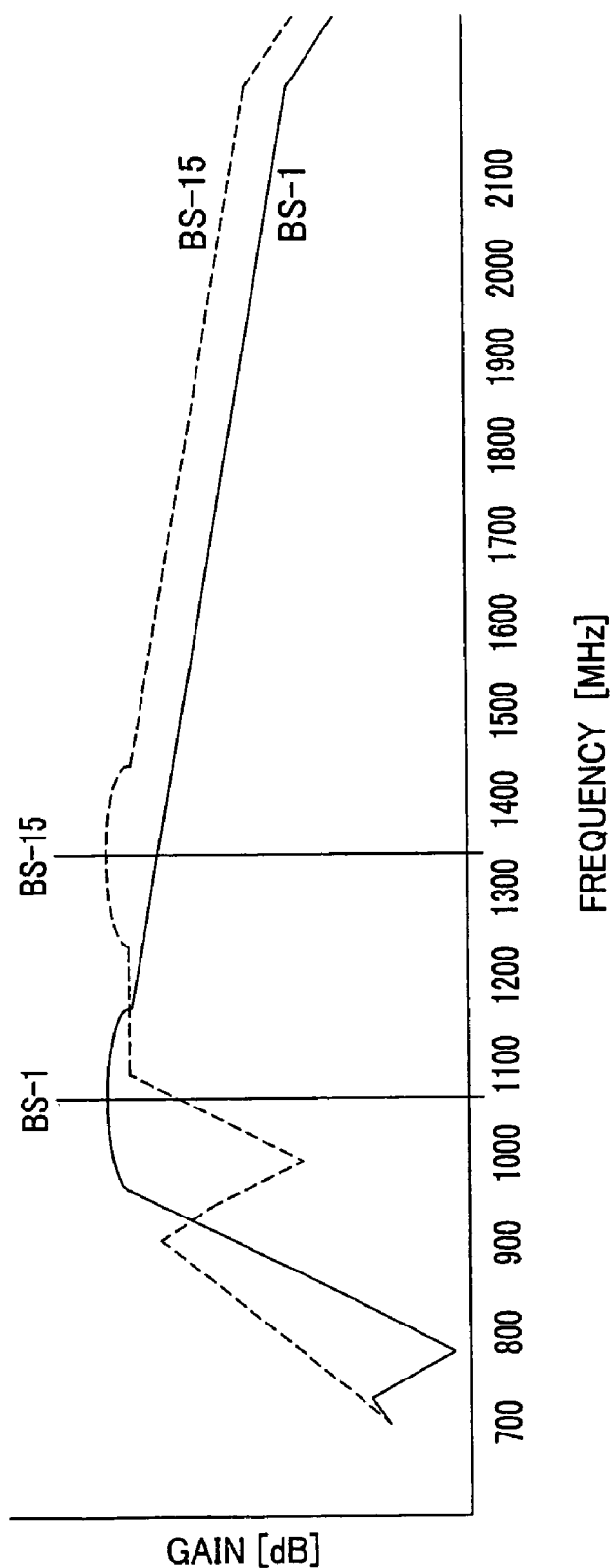
FIG. 5 is a graph illustrating the frequency characteristic of the RF signal transmission system whose RF signal are is amplified by an HPF when BS digital broadcasting is received by a digital tuner circuit of FIG. 2.
Figure 6:
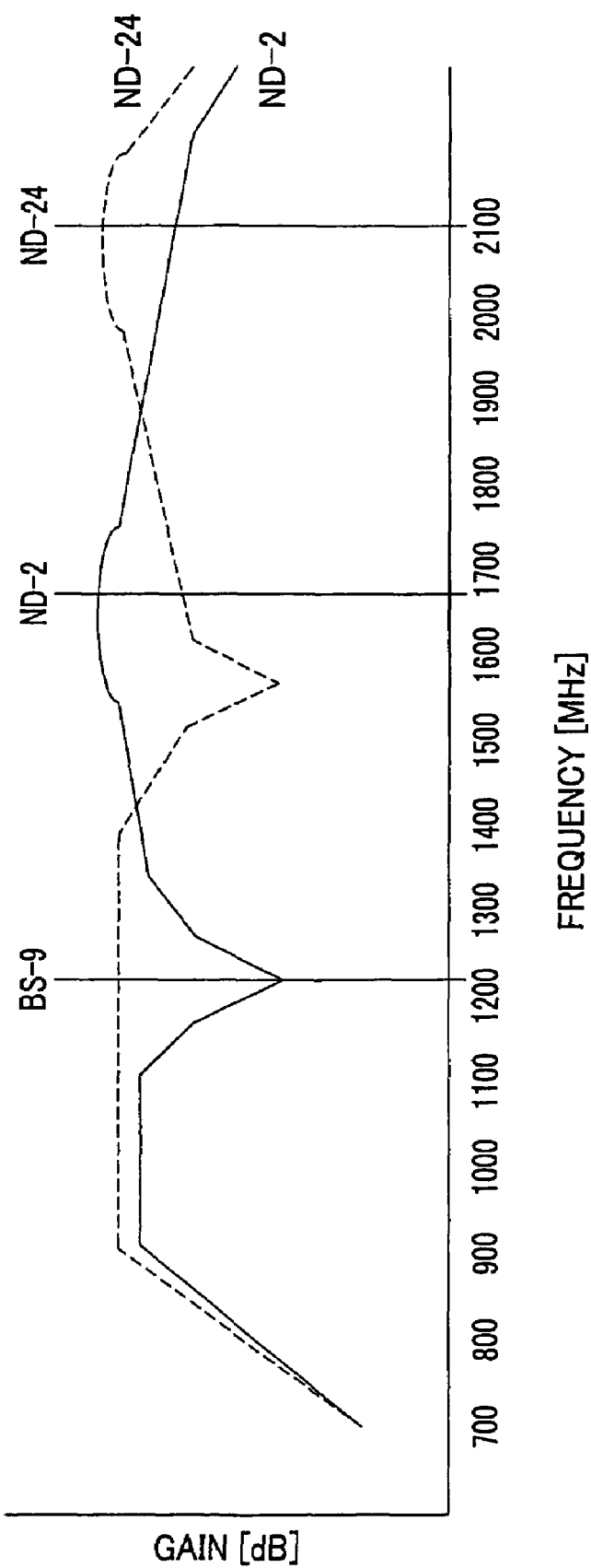
FIG. 6 is a graph illustrating the frequency characteristic of the RF signal transmission system whose RF signal is amplified by an HPF when CS digital broadcasting is received by a digital tuner circuit of FIG. 2.

FIGS. 5 and 6 illustrate the frequency characteristics of RF signals of the RF signal transmission system that pass through the HPF 111. The broken line in FIG. 5 indicates the frequency characteristic of an RF signal that is amplified when BS-15 is selected for BS broadcasting and the solid line in FIG. 5 indicates the frequency characteristic of an RF signal that is amplified when BS-1 is selected for BS broadcasting. In FIG. 5, the gain in the frequency band near that of BS-15 is raised, while that of the frequency band near 990 MHz that corresponds to the third harmonic is reduced. On the other hand, the gain of the frequency band near that of BS-1 is raised, while that of the frequency band near 750 MHz that corresponds to the third harmonic is reduced.

The broken line in FIG. 6 indicates the frequency characteristics of an RF signal that is amplified when ND-24 is selected for CS broadcasting and the solid line in FIG. 6 indicates the frequency characteristic of an RF signal that is amplified when ND-2 is selected for CS broadcasting. In FIG. 6, the gain in the frequency band near that of ND-24 is raised, while that of the frequency band near 1,550 MHz that corresponds to the third harmonic is reduced. On the other hand, the gain of the frequency band near that of ND-2 is raised, while that of the frequency band near 1,200 MHz that corresponds to the third harmonic is reduced.

Thus, the HPF 111 can maintain the gain in the reception frequency band of the RF signal that is input to the high frequency signal receiving circuit section 115 and reduce the gain in the frequency band corresponding to the third harmonic. Additionally, it can reduce interferences of other frequency bands to broad band interferences. As a result, if it is difficult to reduce the third harmonic of the source oscillation output signal by the high frequency signal receiving circuit section 115, the digital tuner circuit 100 can attenuate the level of an RF signal having a frequency band same as the third harmonic so that the problem of frequency conversion of the third harmonic into a base band signal so as to interfere with the I/Q signals of other broadcasting channel frequencies is suppressed.

What is claimed is:

1. A direct conversion type high frequency signal receiver adapted to convert the high frequency signal obtained by receiving a digital broadcast signal from a broadcasting satellite or a communications satellite into a base band signal by frequency conversion, the receiver comprising:

an input circuit for inputting high frequency signals;

a mixer circuit for converting a signal having a desired frequency and obtained from the input circuit into a base band signal by frequency conversion; and a local oscillation output circuit section for supplying the mixer circuit with a signal having a desired frequency to be mixed with the signal from the input circuit;

the local oscillation output circuit section having an source oscillator and a higher harmonic output circuit for taking out a higher harmonic of the output signal of the source oscillator as a signal having a desired frequency;

the input circuit having a frequency characteristic of removing all the higher harmonics of the output signal other than the higher harmonic having the desired frequency.

2. A receiver according to claim 1, further comprising;

a PLL circuit section for receiving an source oscillation output signal of the source oscillator of the local oscillation output circuit section;

the control voltage from the PLL circuit section being used to control the resonance frequency of the source oscillator of the local oscillation output circuit section and the frequency characteristic of the input circuit.

3. A receiver according to claim 2, wherein the PLL circuit section has a frequency divider for dividing the frequency of the source oscillation output signal from the source oscillator of the local oscillation output circuit section by a dividing ratio corresponding to a station selection signal, a phase comparator for comparing the output from the frequency divider with a reference frequency and a frequency-voltage converter for converting the output signal from the phase comparator into the control voltage.

4. A receiver according to claim 2, wherein a resonance circuit is connected to the source oscillator of the local oscillation output circuit section and the resonance frequency of the resonance circuit is controlled by the control voltage from the PLL circuit section, and the input circuit has a characteristic of boosting the higher harmonic of the broadcasting channel frequency to be used for the desired frequency and attenuating higher harmonics other than the higher harmonic found around other broadcasting channel frequencies, the frequency to be boosted and the frequencies to be attenuated being controlled by the control voltage from the PLL circuit section.

5. A receiver according to claim 1, wherein the higher harmonic output circuit of the local oscillation output circuit section is adapted to take out the fourth harmonic of the source oscillation output signal from the source oscillator, and the input circuit is adapted to remove the third harmonic of the source oscillation output signal.

* * * * *